United States Patent [19]
May et al.

[11] Patent Number: 6,130,012
[45] Date of Patent: Oct. 10, 2000

[54] ION BEAM MILLING TO GENERATE CUSTOM RETICLES

[75] Inventors: Charles E. May, Gresham, Oreg.; Thomas J. Goodwin, Austin, Tex.

[73] Assignee: Advanced Micro Devices, Inc., Sunnyvale, Calif.

[21] Appl. No.: 09/229,710

[22] Filed: Jan. 13, 1999

[51] Int. Cl.[7] .............................. G03F 9/00; G23C 14/00
[52] U.S. Cl. .......................................... 430/5; 204/192.33
[58] Field of Search ................................ 430/5, 311, 322; 204/192, 34, 298.36, 192.33; 216/66

[56] References Cited

U.S. PATENT DOCUMENTS

| | | | |
|---|---|---|---|
| 5,273,850 | 12/1993 | Lee et al. | 430/5 |
| 5,635,316 | 6/1997 | Dao | 430/5 |
| 5,876,881 | 3/1999 | Kawata | 430/5 |
| 6,033,811 | 3/2000 | Lee | 430/5 |
| 6,044,007 | 3/2000 | Capodieci | 430/5 |

OTHER PUBLICATIONS

Stanley Wolf and Richard N. Tauber; Silicon Processing for the VLSI Era, vol. 1—Process Technology; pp. 476–489; 1986.

*Primary Examiner*—S. Rosasco
*Attorney, Agent, or Firm*—Timothy M. Honeycutt

[57] ABSTRACT

Various methods of fabricating a reticle are provided. In one aspect, a pattern of opaque structures is formed on a plate capable of transmitting electromagnetic radiation. Adjacently positioned angled surfaces of the opaque structures are identified. Preselected portions of the opaque structures that encompass the adjacently positioned angled surfaces are then removed by ion-beam milling or other methods. Reticle patterns may be customized by modifying the structures of adjacent polygon structures that could otherwise give rise to diffraction-induced patterning errors on resist layers.

29 Claims, 5 Drawing Sheets

ION BEAM MILLING TO GENERATE CUSTOM RETICLES

BACKGROUND OF THE INVENTION

1. Field of the Invention

This invention relates generally to semiconductor processing, and more particularly to a method of fabricating a reticle with customized pattern generation.

2. Description of the Related Art

The minimum possible horizontal feature size of a structure patterned on a semiconductor wafer in conventional processing is dictated, in large part, by the resolution of the photolithographic system used to pattern the wafer. The resolution of an optical photolithographic system is normally an aggregate of a number of physical mechanisms, such as lens aberrations, light spectrum, and diffraction effects. However, diffraction effects constitute the dominant limitation to resolution, particularly in projection printers, and particularly in sub-1.0 $\mu$m processing.

All optical lithography systems direct electromagnetic radiation past various edges and through various slits, and thus involve light diffraction to one degree or another. The edges and slits are natural features of the patterns of polygonal structures on conventional reticles and masks, and may number in the hundreds, thousands, or even millions, depending on the complexity of the reticle. The general effect of diffraction is a spreading of the radiation into regions that are not directly exposed to the oncoming waves. A more localized effect is observed where radiation passes adjacent angled surfaces of two adjacent polygonal structures of the reticle. The inside corner of an L-shaped polygon and the outside corner of an adjacent L-shaped polygon represent one example of such adjacent angled surfaces. The diffraction pattern produced by the interaction of radiation with the adjacent angled surfaces is highly complex and can be difficult to accurately characterize. However, the effects of the complex diffraction pattern may be readily observed by inspecting a resist layer patterned with the reticle. The images of the adjacent L-shaped polygon structures patterned in the resist may exhibit a pronounced bulging in the vicinity of the adjacent angled surfaces, i.e., the adjacent inside and outside corners. This bulging may be extensive enough to actually merge the images of the polygon structures in the resist. Even without merging, the bulging may be extensive enough to cause a bridging of the device structure that is subsequently patterned with the resist. Such bridging can lead to a host of yield-limiting problems, such as shorts and deviations from design rules, to name just a few.

The fabrication of increasingly smaller features in integrated circuits is dependent on the availability of increasingly higher resolution optical lithography equipment. Designers of optical lithography equipment have employed several techniques to combat the deleterious effects of light diffraction. Some of these techniques include decreasing the wave length of the illuminating light, increasing the numerical aperture of the system, increasing the contrast of the resist by modifying resist chemistry or by creating entirely new resists, and adjusting the coherence of the optical system. Even with the availability of these various techniques for increasing the resolution of optical lithography equipment, the best of conventional optical lithography systems have a resolution limit of about 0.2 $\mu$m, and may still produce images with bridged patterns.

Electron beam or "e-beam" lithography has occasionally been used as a substitute for optical lithography in circumstances where the resolution limits of the prevailing optical lithography techniques prevented successful fabrication of a particular integrated circuit. However, there are several drawbacks associated with electron beam lithography, including resolution limitations associated with electrons forward scattered in the resist and back scattered from the substrate, swelling, which often occurs during development of a negative e-beam resist, extremely slow processing times when compared to optical projection systems, and significantly higher cost of electron beam lithography systems compared to optical steppers.

X-ray lithography has also been used occasionally in place of optical lithography to obtain resolutions in the sub-1.0 $\mu$m area. However, as with electron beam lithography, certain technical difficulties have prevented X-ray lithography from supplanting optical lithography as the lithographic process of choice in mass produced integrated circuits. X-ray reticles have proven to be extremely difficult to reliably manufacture and throughput during imaging is notoriously slow.

The present invention is directed to overcoming or reducing the effects of one or more of the foregoing disadvantages.

SUMMARY OF THE INVENTION

In accordance with one aspect of the present invention, a method of fabricating a reticle is provided that includes steps of forming a pattern of opaque structures on a plate capable of transmitting electromagnetic radiation and identifying adjacently positioned angled structures surfaces of the opaque structures. Preselected portions of the opaque structures that encompass the adjacently positioned angled surfaces are removed.

In accordance with another aspect of the present invention, a method of fabricating a reticle is provided that includes the steps of forming a pattern of opaque structures on a plate capable of transmitting electromagnetic radiation and identifying adjacently positioned angled surfaces of the opaque structures. Preselected portions of the opaque structures encompassing the adjacently positioned angled surfaces are removed by ion-beam milling.

In accordance with another aspect of the present invention, a method of fabricating a reticle is provided that includes the steps of forming a pattern of opaque structures on a plate capable of transmitting electromagnetic radiation and identifying adjacently positioned angled surfaces of the opaque structures by digitally filtering a set of layout data for the pattern of opaque structures to locate the adjacently positioned angled surfaces. Preselected portions of the opaque structures encompassing the adjacently positioned angled surfaces are removed by ion-beam milling.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
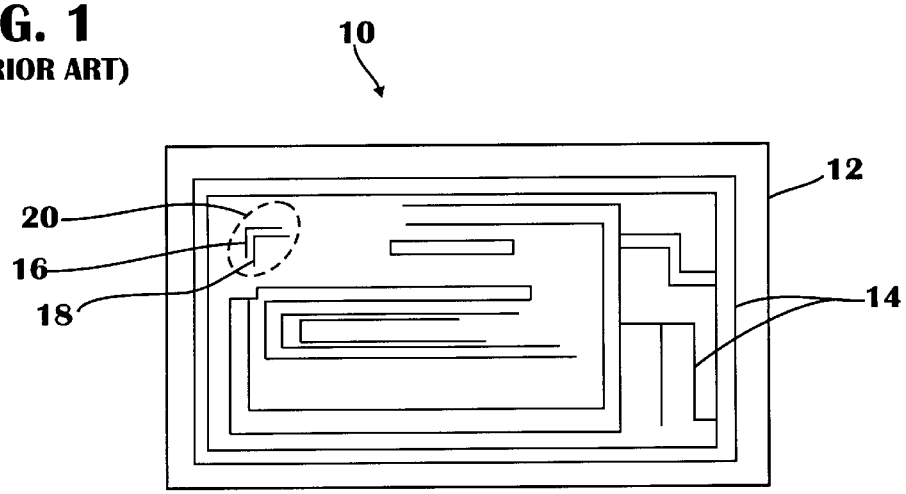
FIG. 1 is a plan view of an exemplary conventional reticle.

In the drawings described below, reference numerals are generally repeated where identical elements appear in more than one figure. FIG. 1 depicts a plan view of an exemplary conventional reticle 10 that consists of a glass plate 12 upon which a pattern of chrome polygon structures 14 are patterned. For the purpose of illustration, two of the chrome polygon structures are designated, singularly, 16 and 18. The reticle 10 is typically formed by sputter depositing a blanket coating of chrome on the glass plate 12. The chrome layer is then coated with photoresist that is, in turn, patterned and developed to yield the desired chrome pattern. The chrome layer is then etched and the photoresist stripped to yield the finished pattern of chrome polygon structures 14.

Figure 2:
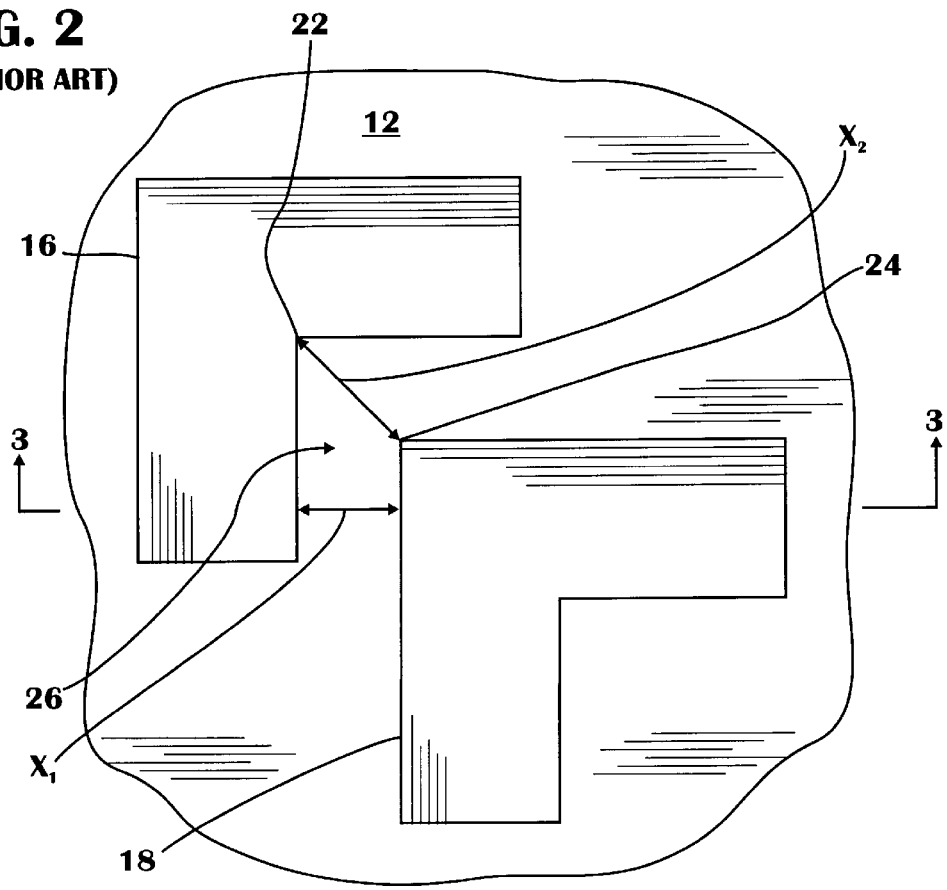
FIG. 2 is a highly magnified plan view of a selected portion of FIG. 1.
Figure 3:
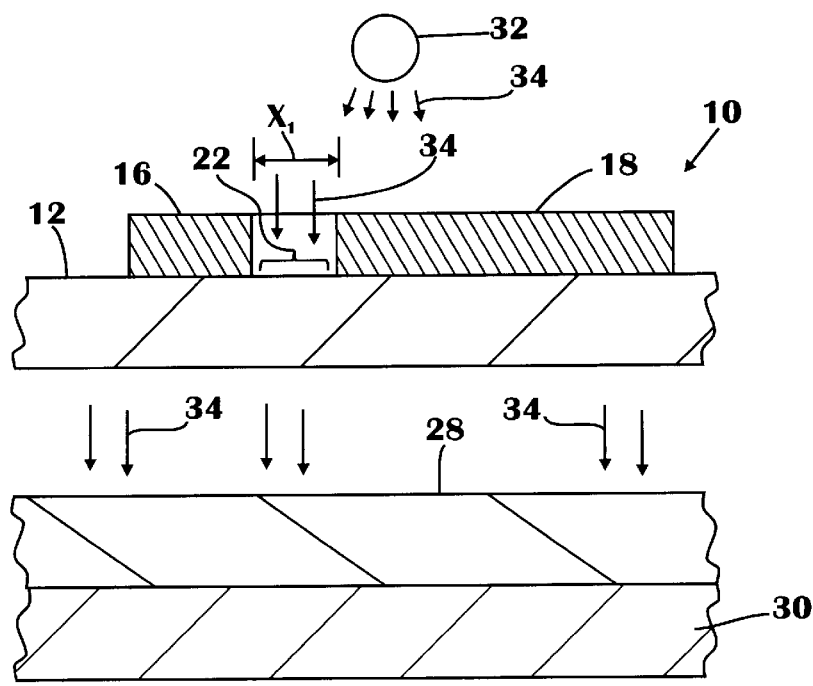
FIG. 3 is a cross-sectional view of FIG. 2 taken at section 3–3.

As noted above, conventional reticle manufacturing techniques can produce reticles that generate diffraction-induced patterning errors in sub-1.0 μm processing of integrated circuits. FIGS. 2 and 3 will now be described to illustrate the problem. FIG. 2 is a highly magnified plan view of the portion of the reticle 10 circumscribed by the dashed oval 20 and shows the polygon structures 16 and 18 at a high magnification. FIG. 3 is a cross sectional view of FIG. 2 taken at section 3–3 and depicts the reticle 10 in use to pattern a layer of photoresist on a wafer. Referring initially to FIG. 2, the polygon structures 16 and 18 are generally L-shaped structures with adjacently positioned angled surfaces 22 and 24. A gap 26 exists between the structures 16 and 18 that has a lateral dimension $X_1$. A distance between adjacent angled surfaces 22 and 24 of the structures 16 and 18 is designated $X_2$. FIG. 3 shows the reticle 10 in use to pattern a photoresist layer 28 on semiconductor wafer 30. The reticle 10 is interposed between an exposure lamp shown schematically and designated 32, and the wafer 30. For simplicity of illustration, the various filtering and magnification lenses that would normally be positioned between the lamp 32 and the reticle 10 and between the reticle 10 and the photoresist 28 are not shown. During exposure of the photoresist 28, photons 34 ejected from the exposure lamp 32 pass through the exposed portions of the reticle glass 12 and strike the photoresist 28. The polygon structures 16 and 18 mask portions of the photoresist 28 from the photons 34. Those photons 34 passing through the gap 26 and near any edge of the structures 16 and 18 will exhibit single-slit and/or edge diffraction effects.

Figure 4:
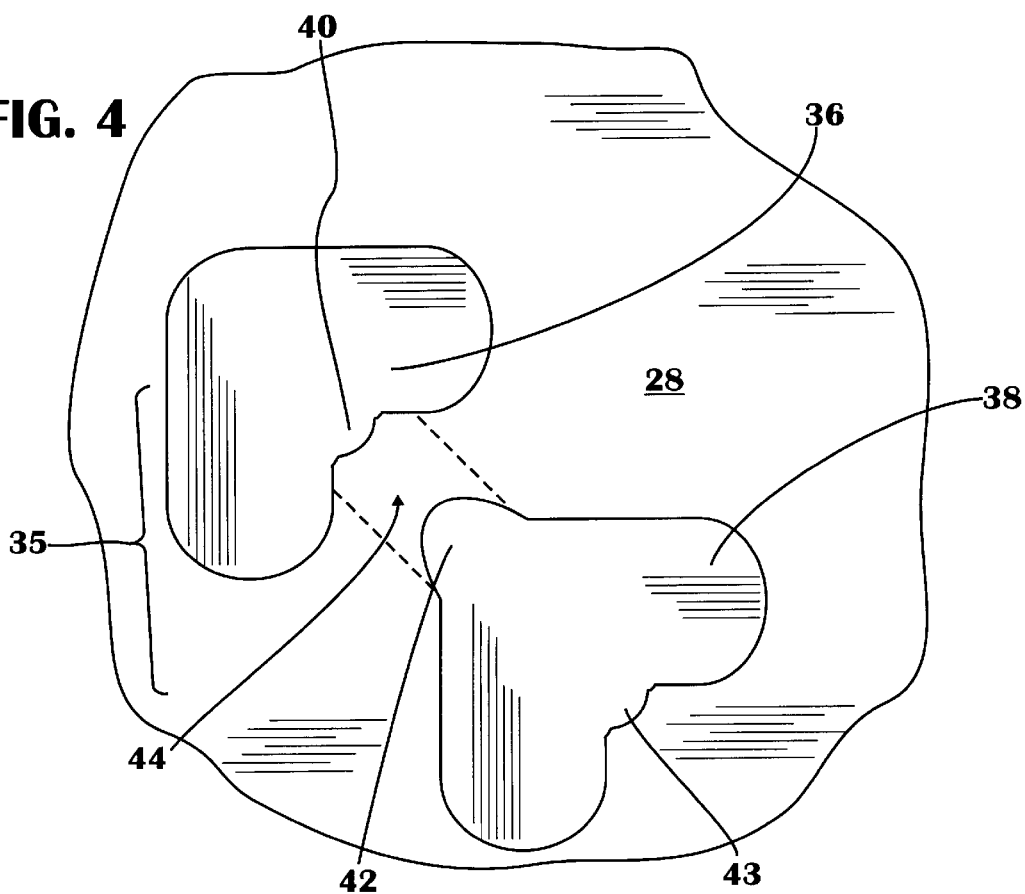
FIG. 4 is a highly magnified plan of a small portion of a resist layer exposed with the conventional reticle of FIG. 1.

The effects of the diffraction on the actual exposure of the photoresist layer 28 may be understood by referring now also to FIG. 4, which is a plan view of the photoresist layer 28 showing the portion thereof 35 that is exposed and the portions 38 and 40 masked by the polygon structures 16 and 18. In the absence of diffraction effects, the unexposed areas 36 and 38 would have the same crisp polygonal shapes as the chrome structures 16 and 18 depicted in FIG. 2. However, as a result of the diffraction effects, the corners of the unexposed areas 36 and 38 are highly rounded. The rounding may be inconsequential at the extremities of the unexposed portions 36 and 38. However, where rounding occurs at adjacent portions of the unexposed areas 36 and 38, such as the bulges 40 and 42, bridging may occur in the area designated 44 in underlying features of the semiconductor substrate that are subsequently patterned after the photoresist layer 32 is fully developed and the undeveloped portions 36 and 38 remain as masks. The bridging in the region 44 may result in short circuiting or other yield limiting problems for the semiconductor wafer 30. The diffraction effects and the attendant potential for edge rounding becomes increasing problematic as the lateral spacing $X_1$ between adjacent structures is scaled, and is most acute, regardless of minimum device geometry, where adjacent chrome polygon structures are patterned with adjacent acute or right-angled surfaces.

Figure 5:
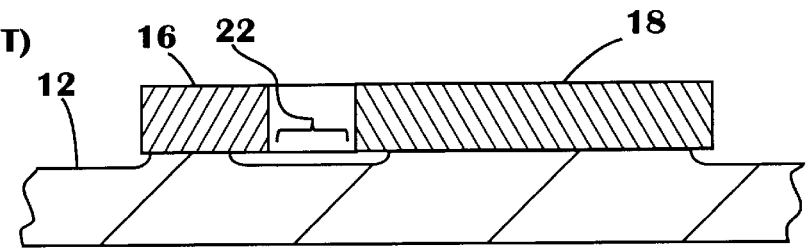
FIG. 5 is a cross-sectional view like FIG. 3, depicting an etch of the glass plate of the reticle of FIG. 1.

One conventional method for compensating for the edge diffraction effects may be understood by referring now to FIG. 5, which is a cross sectional view like FIG. 3. As shown in FIG. 5, the glass plate 12 is isotropically etched following the patterning of the polygon structures 16 and 18. The etch removes a small portion of the upper surface of the glass plate 12 and slightly undercuts the edges of the polygon structures 16 and 18 as shown. The entire exposed surface of the glass plate 12 is etched simultaneously. Thus, the optical characteristics of many portions of the glass plate 12 that would otherwise be unaffected by diffraction effects are changed through the etch. This can lead to unwanted line width variations, deviations from minimum feature size or other processing disadvantages.

Figure 6:
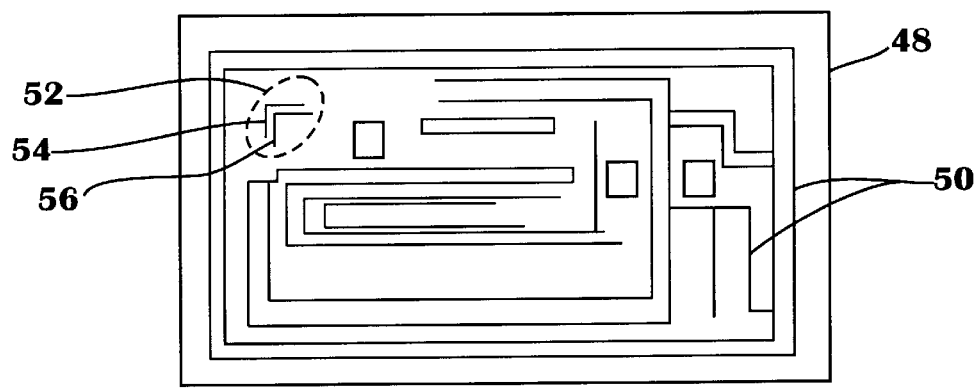
FIG. 6 is a plan view of an exemplary embodiment of a reticle fabricated in accordance with the present invention.

FIG. 6 is a plan view of an exemplary embodiment of a reticle 46 fabricated in accordance with the present invention. As used herein to describe the illustrative embodiments of the present invention and in the claims below, the term "reticle" is intended to encompass both reticles and masks. The reticle 46 is intended for use as a tool to pattern a resist layer by passing a preselected pattern of electromagnetic radiation to the resist layer. Accordingly, the reticle 46 consists of a plate 48 upon which a pattern of opaque structures 50 is patterned. The glass plate 48 is composed of a material capable of transmitting electromagnetic radiation, such as, for example, soda-lime glass, borosilicate glass, quartz or the like. The patterned structures 50 are generally polygonal in shape and may be composed of emulsion, chrome, iron oxide or the like. In the illustrated embodiment, the polygon structures 50 are composed of chrome. The reticle 46 may be dark-field or clear-field as desired. In the illustrated embodiment, the reticle 46 is of clear-field polarity.

As the skilled artisan will appreciate, commercially available resists are manufactured with sensitivity to a variety of wavelengths. Accordingly, the term "opaque" as used herein and in the claims below, is intended to mean incapable of transmitting electromagnetic radiation with a wavelength (es) to which a given resist is sensitive.

Figure 7:
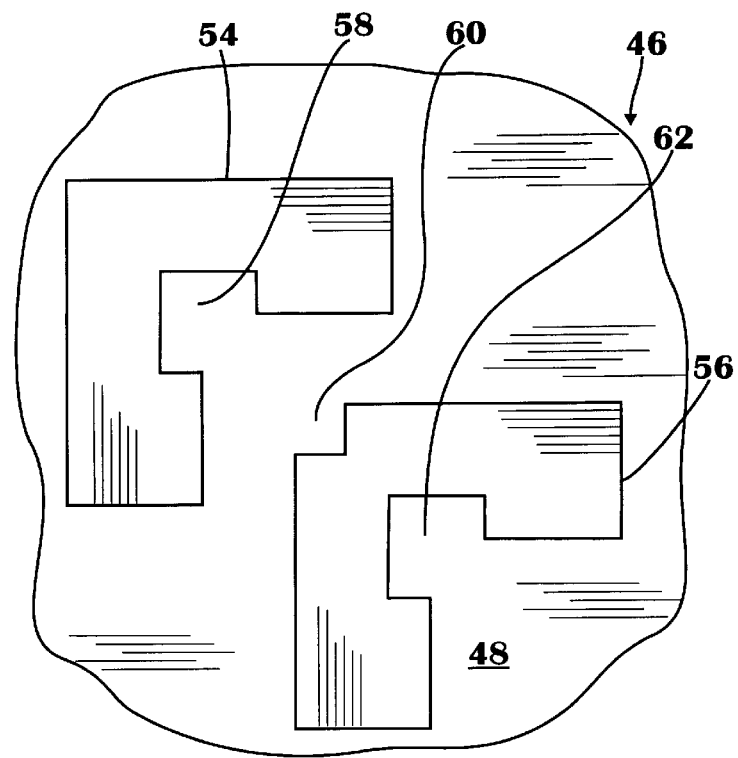
FIG. 7 is a highly magnified plan view of a selected portion of the reticle of FIG. 6 in accordance with the present invention.

Referring now also to FIG. 7, which is a highly magnified plan view of the portion of FIG. 6 circumscribed by the dashed oval 52, two exemplary polygon structures 54 and 56 will be described and used to illustrate an exemplary process flow for fabricating the reticle 46. The structures 54 and 56 are generally L-shaped structures that, as described below, may be initially processed and patterned in a conventional manner to yield generally L-shaped structures of the type depicted in FIG. 2. However, in contrast to conventional reticle manufacture, the structures 54 and 56 are further patterned by establishing cut-outs 58 in the structure 54 and 60 and 62 in the structure 56. The cut-outs 58 and 60 are patterned into the respective structures 54 and 56 to provide a larger gap between the adjacent structures 54 and 56 to aid in ameliorating the deleterious effects of single-slit and edge diffraction described above. The cut-out 62 is similarly patterned into the structure 56. The goal of patterning the cut-outs 58, 60 and 62 is to eliminate the formation of bulges in a resist layer (not shown) patterned using the reticle 46 of the types shown in FIG. 4 and designated 40, 42 and 43.

Figure 8:
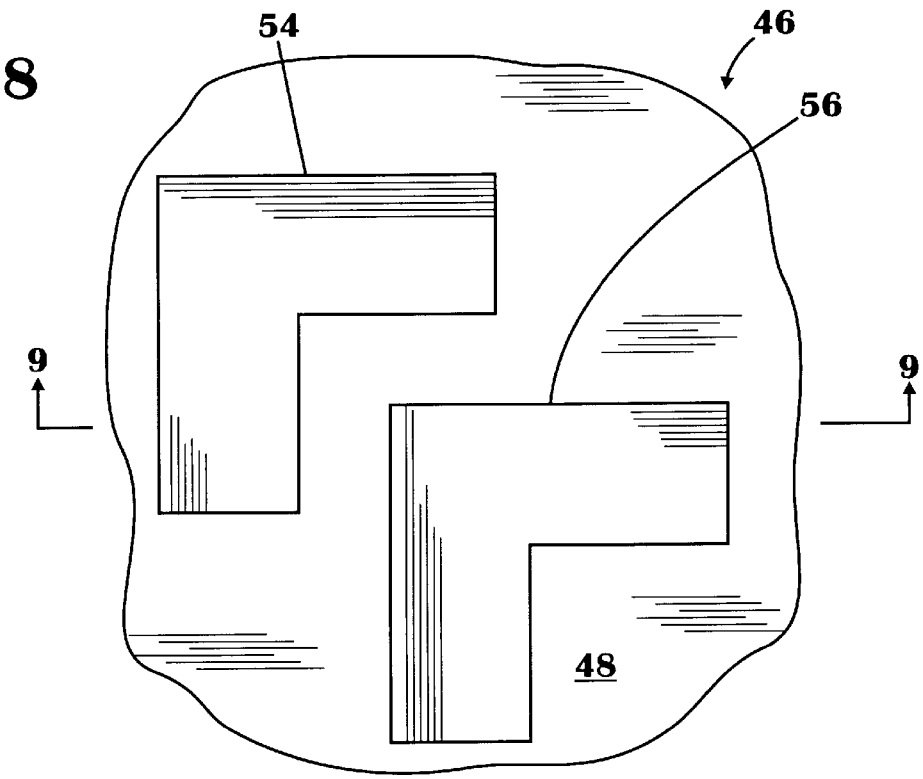
FIG. 8 is a plan view like FIG. 7, but depicts the initial stages of fabricating the reticle in accordance with the present invention.
Figure 9:
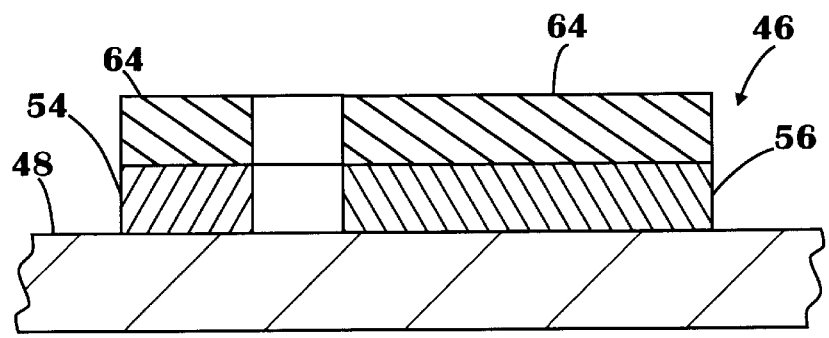
FIG. 9 is a cross-sectional view of FIG. 8 taken at section 9—9 in accordance with the present invention.

An exemplary process flow for fabricating the reticle 46 in accordance with the present invention may be understood by referring now to FIGS. 8 and 9. FIG. 8 is a plan view like FIG. 7 depicting the initial stages of fabrication of the chrome structures 54 and 56 and FIG. 9 is a cross sectional view of FIG. 8 taken at section 9—9. The description will focus on the patterning of the structures 54 and 56. However, the skilled artisan will appreciate that the process is applicable to the balance of the structures 50. Initially, the glass plate 48 is polished, cleaned, rinsed and dried. Next, the polygon structures 54 and 56 are patterned on the glass plate 48 by sputter depositing a layer of chrome of about 500 to 1000 Å in thickness and spin coating a photoresist layer 64 on the chrome layer. The photoresist 64 is patterned, that is, exposed with electromagnetic radiation or e-beam and developed, with the desired initial outline of the polygon structures 54 and 56. Prior to patterning, the photoresist 64 is soft-baked. Following development, but prior to etching of the chrome layer, the resist 64 is hard-baked. The polygon structures 54 and 56 are then patterned by etching the chrome layer with the photoresist 64 in place. The etch may be by wet or chemical plasma etching. Alternatively, the removal may be by e-beam etching. If wet etching is used, a variety of etchant solutions may be appropriate. In an illustrated embodiment, a wet etch is performed using a solution of saturated $Ce(SO_4)_2$ and concentrated $HNO_3$ in a ratio of 9:1. It is anticipated that some undercut of the polygon structures 54 and 56 beneath the photoresist layers 64 will result, although such undercut is not shown in FIG. 9.

Figure 10:
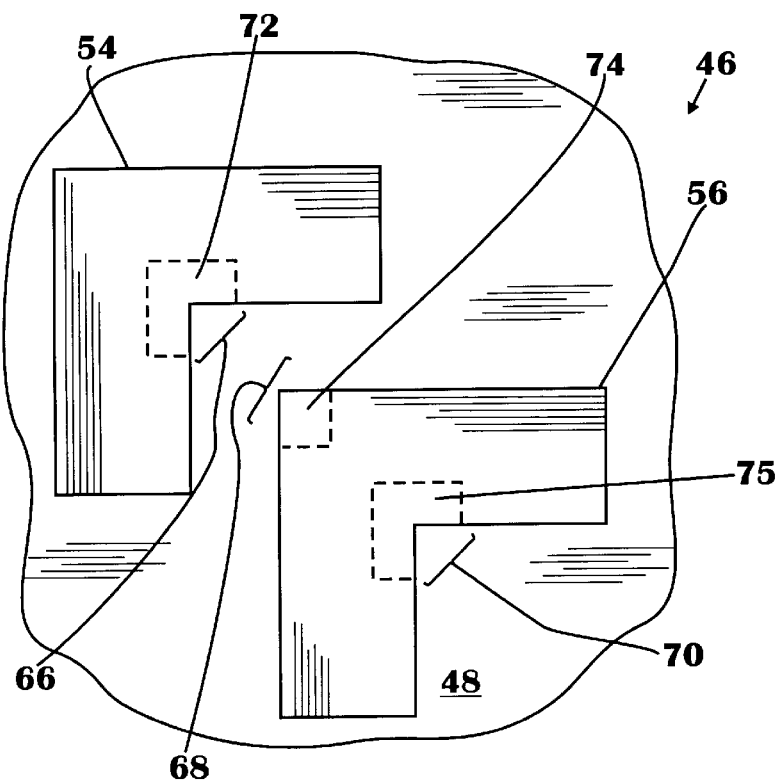
FIG. 10 is a plan view like FIG. 8 depicting the identification and characterization of areas of two adjacent polygon structures targeted for removal in accordance with the present invention.

Referring now to FIGS. 9 and 10, the photoresist layers 64 depicted in FIG. 9 are stripped by ashing or other suitable photoresist stripping technique to yield the partially completed polygon structures 54 and 56 shown in FIG. 10. The portions of the polygon structures 56 that present a risk of diffraction-based errors in the subsequent patterning of masking layers on a wafer are identified. For the structures 54 and 56, the potential bridging spots includes the adjacent angled surfaces 66 and 68 of the respective structures 54 and 56, and the angled surface 70 of the structure 56. The cut-outs 58, 60 and 62 depicted in FIG. 7 will be formed at these locations. The outlines of the later-formed cut-outs 58, 60 and 62 are represented by the dashed areas 72, 74 and 75. The positions of the targeted surfaces 66, 68 and 70 may be determined in a number of different ways. For example, the locations of the targeted surfaces 66, 68 and 70 may be determined empirically by examining a photoresist pattern with a reticle that has the polygon structures 54 and 56 patterned as shown in FIG. 10, and determining where undesirable pattern bulges of the type shown in FIG. 4 and designated 40, 42 and 43 develop. Alternatively, the surfaces 66, 68 and 70 may be determined by manually inspecting the polygon structures 54 and 56 and predicting in advance where diffraction-induced patterning errors may occur.

The identification of the surfaces 66, 68 and 70 may be more efficiently accomplished by filtering the digital layout data for the polygon structures 54 and 56 through an algorithm designed to automatically identify those surfaces of the polygon structures 54 and 56 that pose a risk of diffraction-induced patterning errors in subsequently patterned photoresist layers. The algorithm is designed to sort through the digital layout data of the structures 54 and 56 and search for those areas of the patterned polygon structures 50 shown in FIG. 6 that include any sharply or acutely angled surfaces, any adjacent structures with minimum pitch spacing, and areas with adjacent right angles. In addition to identifying the locations of the surfaces 66, 68 and 70, the algorithm establishes the coordinates, that is, the dimensions of the areas 72, 74 and 75 so that those coordinates may be supplied to an ion beam milling tool during subsequent processing described below. Note that where the positions of the surfaces 66, 68 and 70 are determined manually, by empirical data or visual inspection, the coordinates of the areas 66, 68 and 74 may have to be determined manually as well. The appropriate sizes for the areas 66, 68 and 74 will depend upon a number of factors, such as the magnification setting for the reticle 46, the size of the particular structures 54 and 56 and the wave length of the illuminating radiation, among others. The manner in which the areas 66, 68 and 70 are characterized is largely a matter of design discretion. For example, the areas 66, 68 and 70 may be fractured into composite rectangles which can each be separately defined with a specified height, width, x-coordinate, y-coordinate and an angle relative to the coordinate axes chosen.

The identified and characterized areas 72, 74 and 75 of the structures 54 and 56 are removed by ion beam milling, coherent light (laser) ablation or the like to yield the cut-outs 58, 60 and 62 in the structures 54 and 56 as depicted in FIG. 7. In an exemplary embodiment the, removal is by ion-beam milling. A variety of commercially ion-beam milling tools may be used. Similarly, a variety of ion-beam milling species may used with the ion-beam milling tool, such as, for example, argon, krypton, xenon. Modem ion-beam milling tools routinely include a computer to control to the movements of a stage or carrier that holds a wafer, or the movements of the ion-beam gun, or both. Accordingly, the position and dimension coordinates of the areas 72, 74 and 75 may be loaded into the computer to automate the milling step.

The ion-beam milling process will normally leave some debris that can adversely affect the optics of the reticle 46. Accordingly, thorough solvent cleaning of the reticle 46 should immediately follow the milling step.

Figure 11:
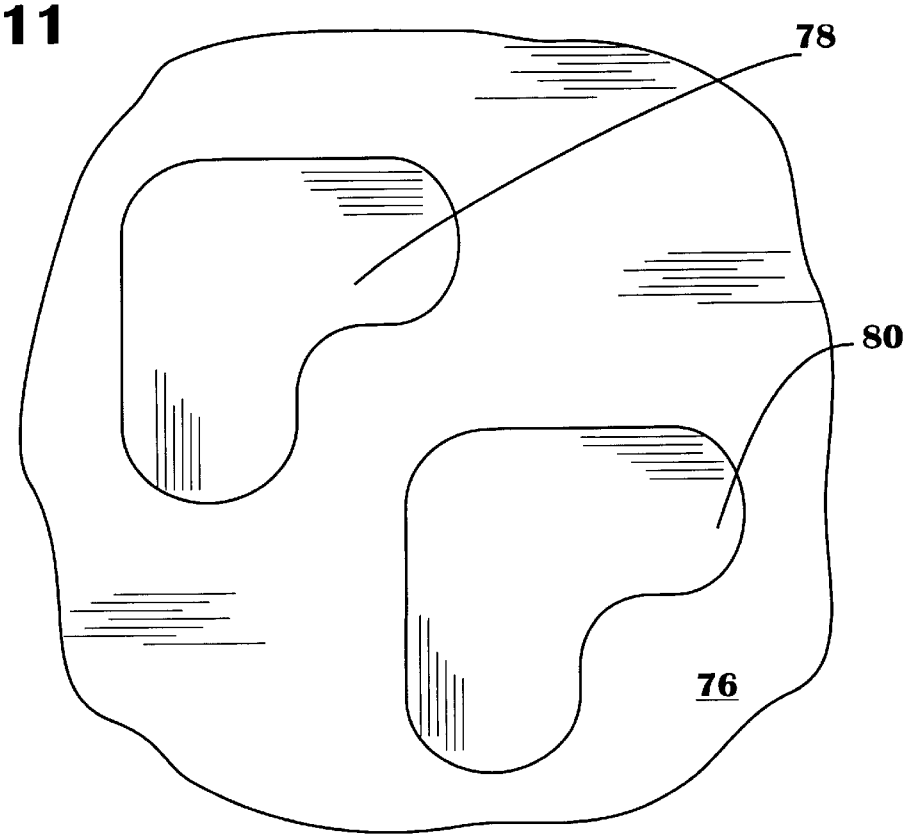
FIG. 11 is a plan view of a resist layer exposed using the reticle of FIG. 6 in accordance with the present invention.

The effect of the customization of the structures 54 and 56 on subsequent resist patterning may be understood by referring now to FIGS. 7 and 11. FIG. 11 is a highly magnified plan view of a small portion of a resist layer 76 following exposure via the reticle 46. The customized polygon structures 54 and 56 diminish edge and slit diffraction effects, resulting in the patterning of unexposed areas 78 and 80 of the resist 76 without the troublesome bulges shown in FIG. 4.

The skilled artisan will appreciate that the process of the present invention enables reticle manufacture with built-in diffraction-induced patterning error control. In contrast to glass plate etching where the optics of otherwise optimal portions of the plate are affected, the method of the present invention enables the tailoring of the optics of a reticle only where the potential trouble-spots are located. Customization of the polygon pattern may be automated by digitally manipulating the preexisting layout database for the reticle pattern. The process may be applied to reticles independent of the exposure wavelength for a given resist.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a reticle, comprising the steps of:
    forming a pattern of opaque structures on a plate capable of transmitting electromagnetic radiation;
    identifying an interior corner of one of the opaque structures, an exterior corner of another of the opaque structures that is adjacent to the interior corner, and a gap between the interior corner and the exterior corner; and
    removing portions of the interior and exterior corners to enlarge the gap and thereby reduce diffraction induced image rounding errors proximate the interior and exterior corners.

2. The method of claim 1, wherein the step of forming the pattern of opaque structures comprises depositing a film of opaque material on the plate, masking the film with a mask having a preselected pattern, and removing the unmasked portions of the film.

3. The method of claim 2, wherein the step of masking the film with a mask having a preselected pattern comprises coating the film with a layer of resist and exposing the resist with light.

4. The method of claim 2, wherein the step of masking the film with a mask having a preselected pattern comprises coating the film with a layer of resist and exposing the resist with an e-beam.

5. The method of claim 1, wherein the step of forming the pattern of opaque structures comprises depositing a film of opaque material on the plate and ablating the pattern in the film with coherent light.

6. The method of claim 1, wherein the step of identifying the adjacent interior and exterior corners comprises digitally filtering a set of layout data for the pattern of opaque structures to locate the adjacently positioned interior and exterior corners.

7. The method of claim 1, wherein the step of removing portions of the interior and exterior corners is performed by a milling tool.

8. The method of claim 7, wherein the milling tool includes a computer for controlling milling operation.

9. The method of claim 8, wherein the step of removing portions of the interior and exterior corners comprises selecting the dimensions of the portions, assigning coordinates to the portions from the set of layout data corresponding to the selected dimensions and inputting those coordinates into the computer of the milling tool.

10. The method of claim 7, wherein the milling tool mills by ion-beam milling.

11. The method of claim 10, wherein the ion-beam milling is performed with ionized argon as the milling species.

12. The method of claim 1, wherein the step of removing portions of the interior and exterior corners comprises ablating the portions with coherent light.

13. A method of fabricating a reticle, comprising the steps of:
    forming a pattern of opaque structures on a plate capable of transmitting electromagnetic radiation;
    identifying an interior corner of one of the opaque structures, an exterior corner of another of the opaque structures that is adjacent to the interior corner, and a gap between the interior corner and the exterior corner; and
    removing portions of the interior and exterior corners by ion-beam milling to enlarge the gap and thereby reduce diffraction induced image rounding errors proximate the interior and exterior corners.

14. The method of claim 13, wherein the step of forming the pattern of opaque structures comprises depositing a film of opaque material on the plate, masking the film with a mask having a preselected pattern, and removing the unmasked portions of the film.

15. The method of claim 14, wherein the step of masking the film with a mask having a preselected pattern comprises coating the film with a layer of resist and exposing the resist with light.

16. The method of claim 14, wherein the step of masking the film with a mask having a preselected pattern comprises coating the film with a layer of resist and exposing the resist with an e-beam.

17. The method of claim 13, wherein the step of forming the pattern of opaque structures comprises depositing a film of opaque material on the plate and ablating the pattern in the film with coherent light.

18. The method of claim 13, wherein the step of identifying the adjacent interior and exterior corners comprises digitally filtering a set of layout data for the pattern of opaque structures to locate the adjacently positioned interior and exterior corners.

19. The method of claim 13, wherein step of ion-beam milling is performed with an ion-beam milling tool that includes a computer for controlling milling operation.

20. The method of claim 19, wherein the step of ion-beam milling comprises selecting the dimensions of the portions, assigning coordinates to the portions from the set of layout data corresponding to the selected dimensions, and inputting those coordinates into the computer of the milling tool.

21. The method of claim 13, wherein the ion-beam milling is performed with ionized argon as the milling species.

22. A method of fabricating a reticle, comprising the steps of:
    forming a pattern of opaque structures on a plate capable of transmitting electromagnetic radiation;
    identifying an interior corner of one of the opaque structures, an exterior corner of another or the opaque structures that is adjacent to the interior corner, and a gap between the interior corner and the exterior corner by digitally filtering a set of layout data for the pattern of opaque structures to locate the interior and exterior corners; and
    removing portions of the interior and exterior corners by ion-beam milling to enlarge the gap and thereby reduce diffraction induce image rounding errors proximate the interior and exterior corners.

23. The method of claim 22, wherein the step of forming the pattern of opaque structures comprises depositing a film of opaque material on the plate, masking the film with a mask having a preselected pattern, and removing the unmasked portions of the film.

24. The method of claim 23, wherein the step of masking the film with a mask having a preselected pattern comprises coating the film with a layer of resist and exposing the resist with light.

25. The method of claim 23, wherein the step of masking the film with a mask having a preselected pattern comprises coating the film with a layer of resist and exposing the resist with an e-beam.

26. The method of claim 22, wherein the step of forming the pattern of opaque structures comprises depositing a film of opaque material on the plate and ablating the pattern in the film with coherent light.

27. The method of claim 22, wherein step of ion-beam milling is performed with an ion-beam milling tool that includes a computer for controlling milling operation.

28. The method of claim 27, wherein the step of ion-beam milling comprises selecting the dimensions of the portions, assigning coordinates to the from the set of layout data corresponding to the selected dimensions, and inputting those coordinates into the computer of the milling tool.

29. The method of claim 22, wherein the ion-beam milling is performed with ionized argon as the milling species.

* * * * *